United States Patent [19]
Zimmerman et al.

[11] Patent Number: 5,387,887
[45] Date of Patent: Feb. 7, 1995

[54] MINIATURE DIGITALLY CONTROLLED PROGRAMMABLE TRANSVERSAL FILTER USING LSI GAAS INTEGRATED CIRCUITS

[75] Inventors: Dale E. Zimmerman, Dallas; James W. Culver, Richardson; Carl M. Panasik, Garland, all of Tex.

[73] Assignee: Texas Instruments Incorporated, Dallas, Tex.

[21] Appl. No.: 205,751

[22] Filed: Mar. 4, 1994

Related U.S. Application Data

[63] Continuation of Ser. No. 196,930, May 20, 1988, abandoned.

[51] Int. Cl.6 .................. H03H 7/38; H03H 9/00; H03H 9/205
[52] U.S. Cl. ................... 333/166; 333/193; 333/196
[58] Field of Search ............ 333/150–155, 333/193–196, 166, 277–278, 261–264; 310/313 R, 313 B, 313 C, 313 D

[56] References Cited

U.S. PATENT DOCUMENTS

| | | | |
|---|---|---|---|
| 3,678,401 | 7/1972 | Adler | 330/277 X |
| 3,979,700 | 9/1976 | Groce | 310/313 B X |
| 4,245,330 | 1/1981 | Rebourg | 364/821 X |
| 4,734,751 | 3/1988 | Hwong et al. | 330/277 X |
| 4,752,750 | 6/1988 | Zimmerman et al. | 333/166 |

OTHER PUBLICATIONS

Moncrecf, Frank J.; "Monolithic SAW Devices Grown on GaAs for Signal Processing"; *Microwaves;* vol. 19, No. 2; Feb. 1980; p. 13.

Gianfranco Manes et al.–"A Microprocessor Controlled Transversal Filter Based on a Surface Acoustic Wave Delay Line", Alta Frequenza, vol. 51, No. 3, May–Jun. 1982; pp. 134–142.

*Primary Examiner*—Gregory C. Issing
*Attorney, Agent, or Firm*—René E. Grossman; Richard L. Donaldson

[57] ABSTRACT

A digitally controlled programmable transversal filter (DCPTF) employing a lithium niobate surface acoustic wave (SAW) delay line and two large scale integration (LSI) gallium arsenide integrated circuits to digitally control the magnitude and sign of the 32 tap weights from the delay line. The DCPTF results in a significant reduction in size over the prior art with little sacrifice in performance. The DCPTF is completely programmable and is constrained only by the bandwidth and the number of taps.

18 Claims, 3 Drawing Sheets

MINIATURE DIGITALLY CONTROLLED PROGRAMMABLE TRANSVERSAL FILTER USING LSI GAAS INTEGRATED CIRCUITS

This application is a continuation of application Ser. No. 07/196,930, filed May 20, 1988 now abandoned.

BACKGROUND OF THE INVENTION

1. Field of the Invention

This invention relates to signal processors and, more specifically, to digitally controlled programmable transversal filters using LSI GaAs integrated circuits.

2. Brief Description of the Prior Art

Many applications exist for communication receivers for use in aircraft wherein an interfering signal is present, such as one from an adversary or from oneself. It is necessary to define a device capable of operating at high frequencies (i.e., 100 to 400 megahertz) which can rapidly identify and remove such interfering signal. This is generally accomplished by means of a filter which can remove the unwanted signal or a filter which passes a wanted signal.

It is known that RF and analog functions are a major factor in the cost of such communications receivers for use in aircraft communications, navigation and identification (CNI) equipment. A cost effective approach to this problem involves the use of programmable filters. Programmability of the filter function is the basis for integrating several communications functions into a single piece of equipment. It is therefore necessary that programmable filters be developed which provide high performance, are efficient and are usable in a wide variety of systems.

Several prior art approaches have been developed to insert programmable filters into CNI systems. One such prior art system uses a GaAs CCD delay line with fixed tap weights. The center frequency of the filter is programmed by the clock frequency. Achievable sidelobe levels in such systems are limited by clock jitter. Dynamic range is limited both by finite signal handling capability of the CCD and by clock noise.

A second prior art approach uses a cascade of GaAs sample/hold devices as a tapped delay line and an array of fixed capacitors for tap weighting. Several capacitor arrays are included on a single chip to switch between lowpass, highpass and bandpass responses. Fourteen such chips must be cascaded to implement a useful CNI filter.

Both of the above described prior art approaches have been demonstrated as a narrow bandpass filter, but full tap weight programmability is required for an adaptive interference suppression application.

A third prior art approach utilizes a separate SAW delay line for each bit of tap weight programming accuracy. The signal from each delay line tap is switched between a positive and negative summing bus. There is a separate set of summing buses for each delay line. The buses are weighted using binarily scaled attenuators and summed so that the overall response is the superposition of the responses from the individual delay lines.

A fourth prior art approach takes advantage of the piezo-resistive effect by propagating a SAW through large FETs spanning the acoustic path. The SAW modulates the FET depletion regions.

A fifth prior art approach utilizes an acoustic charge transport (ACT) device which uses a CW surface wave to transfer packets of charge. The charge (RF signal) is injected into one half wavelength of the SAW (a localized depletion region) from an input (FET) electrode. The SAW carries the charge packet under any number of non-destructive sense electrodes which detect the presence of the charge. The SAW is used only as a conveyor belt.

A sixth prior art approach uses an array of voltage variable MOS capacitors for tap weight programming. The MOS capacitor array chip is mounted over the SAW device. The capacitor array is coupled to the SAW taps via a thin air gap. As a result, fabrication is extremely difficult.

A seventh prior art approach is the analog controlled programmable transversal filter (PTF) which is a well known and extremely versatile wideband signal processor. Such devices operate as bandpass, band-reject, adaptive or matched filters as discussed in a publication of C. M. Panasik et al., Proc. IEEE NAECON, pp. 1074–1080, June 1982.

In addition to the above, a hybrid programmable transversal filter has been described by D. E. Zimmerman et al.; Proc. IEEE MTTS, pp. 251–254, June 1985 and by C. M. Panasik et al.; Proc. IEEE Ultrasonics Symposium, October 1985 that employs a lithium niobate SAW delay line and two dual-gate FET arrays. This approach requires 64 external D/A converters for programming, making it impractical in a compact adaptive interference suppression system.

SUMMARY OF THE INVENTION

In accordance with the present invention, the above noted prior art and specifically the hybrid programmable transversal filter is improved by providing a single chip wherein the dual-gate FET arrays and external D/A converters are replaced with LSI GaAs integrated circuits which enable direct interfacing to TTL signals.

The DCPTF in accordance with the present invention includes a tapped SAW delay line, the output electrodes of which are connected to two identical programmable tap weight control amplifier arrays in the form of GaAs integrated circuits. The RF signal is applied to an input transducer which generates a surface acoustic wave that propagates down the lithium niobate substrate to an array of output electrodes or taps. Each output electrode detects and transforms this acoustic wave to an electrical signal. Due to the delay between output electrodes, each electric signal from a continuing downstream tap is a more delayed copy of the original input.

The signals from the taps pass to the inputs of associated RF unit cells. The two outputs (+ and −) of each of these cells are connected to + or − summing buses. Negative tap weights are generated by inverting one bus in an external 180 degree hybrid combiner.

Each unit cell includes two digitally controlled variable gain amplifiers (DCVGA). Each DCVGA includes, in the preferred embodiment, seven dual gate FETs where the gain of each FET is binarily scaled relative to the prior FET, i.e., $2^n$ where $n=0, \ldots, 6$). The scaling is accomplished by adjusting the length and width of the gates of the FET. Gate-2 (G2) voltages are used for gain programming, however each FET is programmed either to its maximum gain (on state) or to zero gain (off state). Since all FETs are in parallel, the overall amplifier gain is the sum of the gains of the FETs that are programmed to the on state. Each gate-2 line controls one bit (binary representation) of the desired tap weight. The amplifier is capable of being programmed discretely to any gain from 0 to $2^{n+1}-1$. The n+1 FETs are programmed by an n+1 bit digital bus and form a digitally controlled variable gain amplifier. When connected to the external (off chip) 180 degree hybrid, this arrangement is programmed discretely to any gain from −1 to +1 with n+1 bit resolution.

The digitally controlled variable gain amplifier eliminates the analog control voltages and hence the external D/A converters. However, the number of control lines has been increased by a factor of n+1. Therefore, some type of on-chip data multiplexing and storage is required. To solve this problem, each pair of dual-gate FETs (+ and −) shares a static storage cell. Each storage cell has a load line (L) and a data line (D). There are n+1 data lines, one for each bit and one load line for each tap from the SAW. The arrangement of a positive weight amplifier, a negative amplifier and n+1 memory cells makes up a unit cell.

The digital inputs to the unit cell are at nonstandard voltage levels so TTL interface buffers have been designed. These buffers are fabricated separately from the unit cell on the same slice and can be bonded to the digital inputs to provide TTL interfacing.

DESCRIPTION OF THE PREFERRED EMBODIMENT

Figure 1:
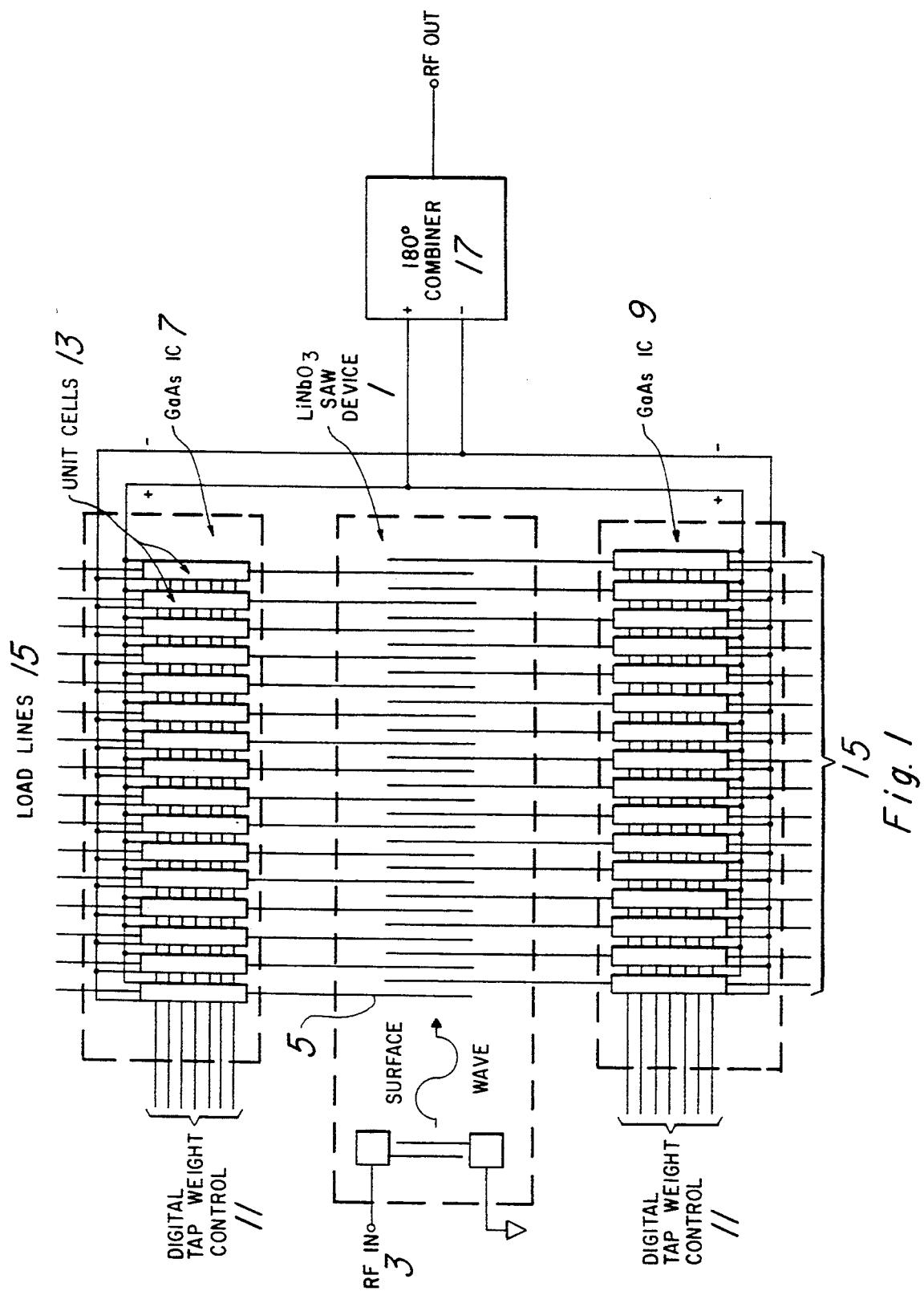
FIG. 1 is a block diagram of a digitally controlled programmable transversal filter in accordance with the present invention.

Referring first to FIG. 1, there is shown a digitally controlled programmable transversal filter in accordance with the present invention. The filter includes a lithium niobate SAW device 1 in the form of a tapped delay line. An acoustic wave is launched in well known manner from the RF input terminals 3 and is propagated down the SAW device in the direction of the arrow. A plurality of output taps 5, are positioned along the SAW device, where 16 such taps are shown extending outwardly from each side of the device. The output taps are spaced from each other by a predetermined distance to provide a desired delay, such as, for example, 5 nanoseconds between taps. The output taps are each coupled to one of an array 7 or 9 of unit cells or amplifiers 13. Each array of amplifiers 7 and 9 is formed on a separate single GaAs chip. A digital tap weight control formed of seven control lines 11, which is in the form of a data signal, is coupled to each of the amplifiers 13 to control the on or off condition of the FETs thereof as will be discussed hereinbelow. Load lines 15 are individually connected to each of the amplifiers 13 to control operation thereof as will be described in detail hereinbelow. The + and − outputs of each of the amplifiers 13 are summed together in a 180 degree combiner 17 to generate an RF output.

Figure 2:
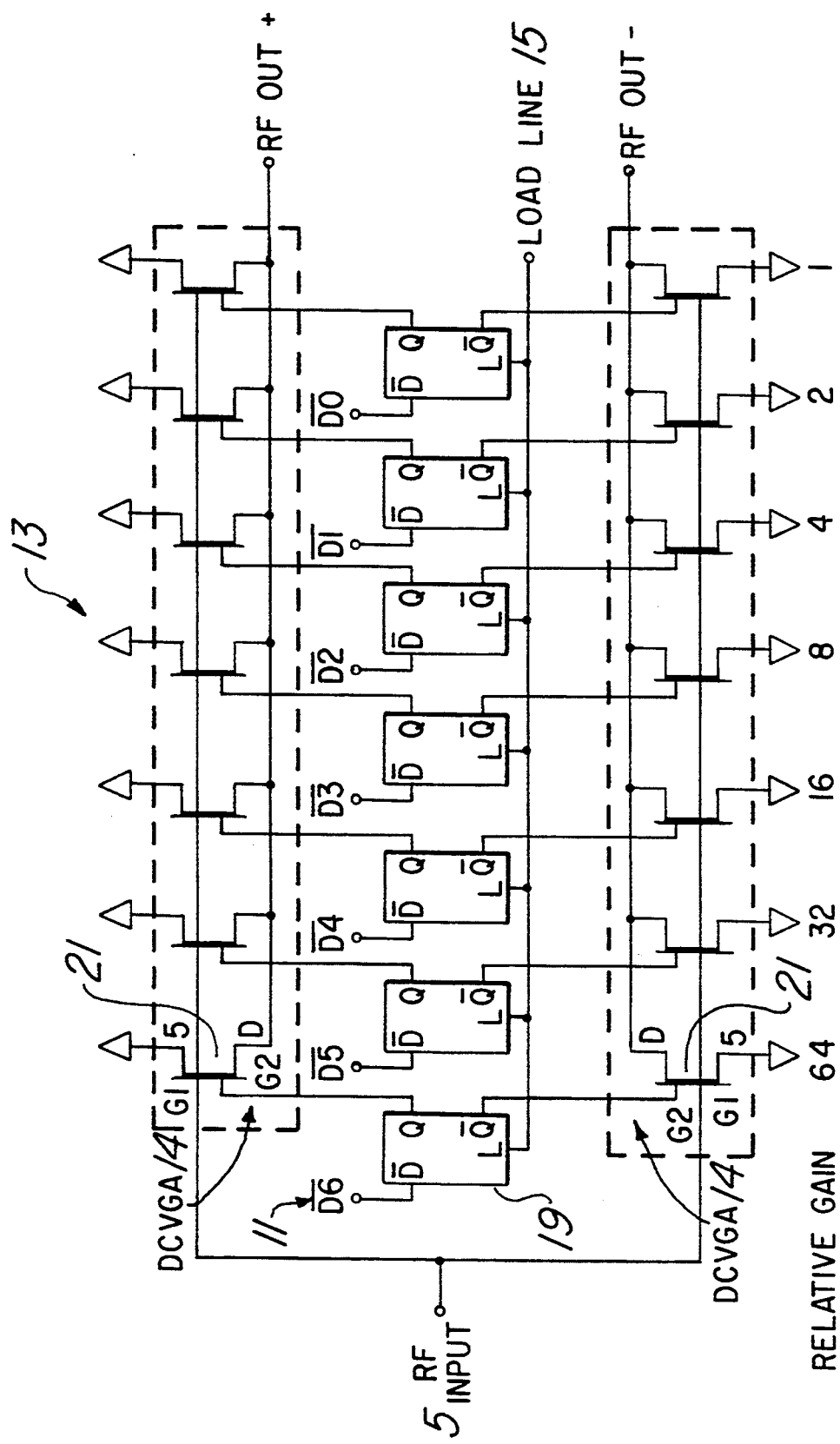
FIG. 2 is a circuit diagram of one of the unit cells of FIG. 1.

Referring now to FIG. 2, there is shown a circuit diagram of one of the unit cells 13 of the arrays 7 and 9. Each of the amplifiers 13 includes a plurality of storage cells 19 (shown in detail in FIG. 3), each storage cell including an input (D0bar to D6bar) and outputs Q and Qbar, the outputs being the complement of each other.

Each storage cell 19 also includes a load input (L) 15. The outputs Q and Qbar are the control inputs to the dual gate FETs 21 and are individually coupled to one of the gates (gate-2) of the dual gate FETs, the other gate (gate-1) thereof being the RF input 5 which is coupled to the associated electrode on the surface of the SAW device 1. The source ohmic contacts of FETs 21 are coupled to ground and the drain ohmic contacts (summed together) thereof are the outputs of the amplifiers 14, all said outputs being coupled to the corresponding RF out + or RF out − terminal. The FETs 21 are turned fully on or fully off when operated, depending upon the input thereto. Each of the FETs 21 from left to right in each amplifier 14 is scaled to provide a binarily smaller gain than the FET immediately to its left as shown in FIG. 2.

Figure 3:
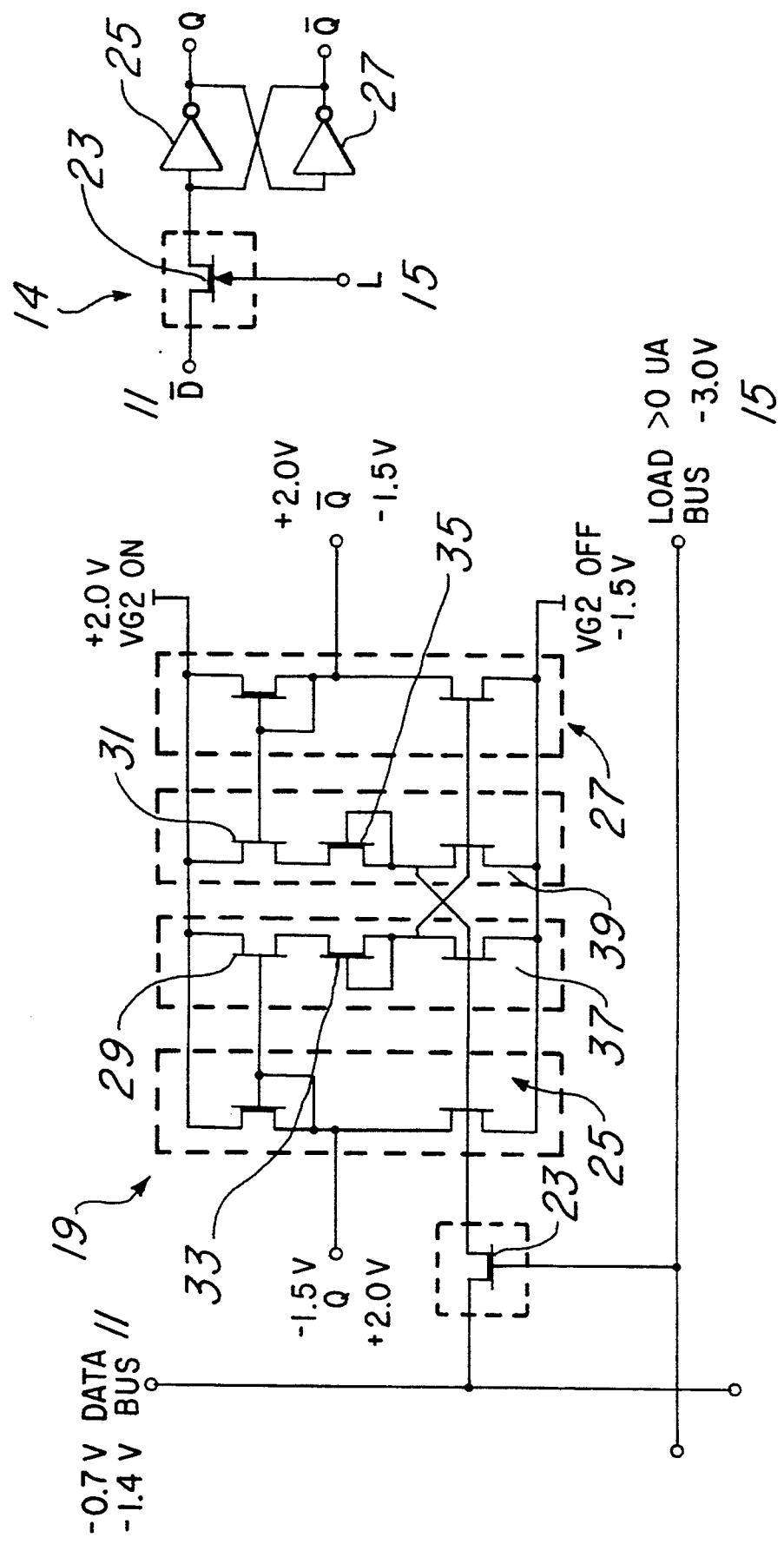
FIG. 3 is a circuit diagram of the static storage cell with level shift circuit which allows the output voltages of the cell to match those required for the dual-gate FET gate-2.

The storage cell 19 is shown in detail in FIG. 3 and includes an access FET 23 having its source coupled to the Dbar input 15 and its gate coupled to the Load (L) input. The drain of FET 23 is coupled to two cross coupled inverters 25 and 27 at the input of an inverter 25 and the output of an inverter 27, the output of inverter 25 being the Q output and being coupled to the input of inverter 27. The output of inverter 27 is the Qbar output. The load line (L) 15 is a signal which is provided to indicate that data should be loaded into the storage cells 19 and the data line (D0bar . . . D6bar) 11 provides the data to be loaded into the static cell when the load line is operated.

Since the inverters 25 and 27 use MESFETs, they are incapable of providing voltages above 0.7 volt and cannot go below zero volts. Accordingly, the largest voltage swing available is 0.7 volts. For the FETs 21 herein, a voltage swing of about 3 volts is required. Accordingly, a level shift is provided by the addition of transistors 29, 31, 33, 35 37 and 39. This permits the Q and Qbar outputs of the storage cell 19 to operate at the high and low levels to provide the 3 volt swing required.

In operation, referring to FIG. 1, assuming that the tap weights (D0bar . . . D6bar) 11 have been loaded, each of the amplifiers or unit cells 13 has a particular gain as determined by the "Dbar" signals. The RF signal is applied to the SAW device at the RF input terminals 3 to the left thereof and is transformed to an acoustic wave which propagates down the SAW device 1 to the right, as shown by the arrow. When this acoustic wave strikes the first tap or electrode 5 in its path, the electric field is detected by that electrode and a signal is passed to the unit cell 13 in the upper array 7 coupled thereto, this being the first RF input shown in FIG. 2. This signal is multiplied by some value as determined by the "Dbar" inputs 11 and is passed to both RF out + and − lines (FIG. 2). These lines are coupled to their respective + and − inputs of the 180 degree combiner 17. At a predetermined later time, determined by the material of the SAW 1 and the spacing of the electrodes 5 on the SAW, the propagated wave strikes the second electrode 5 and is passed to the unit cell 13 in the array 9 coupled thereto, this being the first RF input in the lower array. This signal is multiplied by some value as determined by the "Dbar" input of that amplifier and is passed both to the + and − RF out lines. These lines are coupled to their respective + and − inputs of the 180 degree combiner 17. The first electrode 5, meanwhile, has continued to receive and amplify later propagated signals, either of the continuous or discrete type. This procedure continues for all of the unit cells of the array. Typically about 100 such unit cells would be required, though this number is not critical.

It can be seen that, as the originally propagated wave strikes the second electrode and thereafter, a plurality of signals will be continually passed to the RF out + and RF out − lines, two from each unit cell 13, one to RF out + and one to RF out −, and be combined in the 180 degree combiner 17 whereas the data from these two lines is combined and sent out along the RF out line.

In the event the tap weights of the unit cell as shown in FIG. 2 are to be changed, it is merely necessary to apply the necessary signals on tap weight control lines 11 (D0bar . . . D6bar). This applies these "D" signals to all of the unit cells 13 simultaneously. To provide the desired amplification at a specific unit cell, the load line (L) 15 for only that particular unit cell is pulsed by bringing the load line high and then bringing it low. This will set only the unit cell wherein the load line L was pulsed. This change in weight can be performed on a unit cell by unit cell basis or in multiple unit cells simultaneously for the same weighting.

It can be seen that a transversal filter has been provided wherein the impulse response is implemented directly through the tap weights.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. An RF digitally controlled programmable transversal filter, comprising:
   (a) an acoustic delay line having a direction of wave propagation and a plurality of taps spaced therealong in said direction of wave propagation;
   (b) means for launching a surface acoustic wave along said acoustic delay line in response to an RF input signal;
   (c) a plurality of digitally controlled cells, each said cell having unique externally programmable digital means establishing the gain thereof, each said tap controlling an associated cell responsive to receipt of said surface acoustic wave at said tap, each said cell having an output; and
   (d) means for combining the outputs of said cells.

2. A filter as set forth in claim 1 wherein each said cell includes a first plurality of amplifiers and a second plurality of amplifiers equal in number to said first plurality of amplifiers, each of said first and second plurality of amplifiers having an input and providing an output, the output of said first plurality of amplifiers being the binary complement of the output of said second plurality of amplifiers and said means for combining including means to combine the outputs of said first plurality of amplifiers from each of said cells and means to combine the outputs of said second plurality of amplifiers from each of said cells.

3. A filter as set forth in claim 2 wherein each said cell further includes a plurality of storage members equal in number to said first plurality of amplifiers, each said storage member having an input and a pair of binary outputs, one of said binary outputs being the complement of the other said binary output, one of said binary outputs of each storage member controlling a predetermined one of said first plurality of amplifiers and the other said binary output controlling predetermined one of said second plurality of amplifiers.

4. A filter as set forth in claim 1 wherein each said cell has an input and a predetermined tap weight, each said cell including means to provide at said output a first output signal of predetermined amplitude determined by said predetermined tap weight responsive to an input signal at said input thereof of a first type and means to provide at said output a second output signal of predetermined amplitude determined by said predetermined tap weight responsive to an input signal at said input thereof of a second type which is the complement of said input signal of the first type.

5. A filter as set forth in claim 2 wherein said amplifiers are dual gate FETs.

6. A filter as set forth in claim 3 wherein said amplifiers are dual gate FETs.

7. A filter as set forth in claim 4 wherein said means to provide said first output signal and said means to provide said second output signal are dual gate FETs.

8. A filter as set forth in claim 5 wherein a respective gate of each FET is coupled to a respective tap.

9. A filter as set forth in claim 6 wherein a respective gate of each FET is coupled to a respective tap.

10. A filter as set forth in claim 7 wherein a respective gate of each FET s coupled to a respective tap.

11. A filter as set forth in claim 5 wherein each of said binary outputs of said cell is coupled to a corresponding one of the other of said gates.

12. A filter as set forth in claim 6 wherein each of said binary outputs of said cell is coupled to a corresponding one of the other of said gates.

13. A filter as set forth in claim 9 wherein each of said binary outputs of said cell is coupled to a corresponding one of the other of said gates.

14. A filter as set forth in claim 1 wherein said acoustic delay line is on lithium niobate and said cells are on gallium arsenide.

15. A unit cell including:
   (a) a plurality of first devices, each said first device having an input signal applied thereto and, in response to said input signal, providing a first output having predetermined voltage swing and a second output having said predetermined swing which is the complement of said first output;
   (b) a first plurality of amplifiers, each said first amplifier being controlled by a respective first output of a respective one of said first devices; and
   (c) a second plurality of amplifiers, each said second amplifier being controlled by a respective second output of said respective one of said first devices.

16. A unit cell as set forth in claim 15 wherein each of said amplifiers of said first plurality of amplifiers has a different gain and each of said amplifiers of said second plurality of amplifiers has a different gain.

17. A unit cell as set forth in claim 16 wherein the gain of each amplifier of said first plurality of amplifiers vary in accordance with a geometric progression.

18. A unit cell as set forth in claim 15 further including voltage level shift means in each of said first devices to increase the swing of the voltage at said first and second outputs thereof.

* * * * *